United States Patent [19]

Koenig et al.

[11] Patent Number: 4,894,621

[45] Date of Patent: Jan. 16, 1990

[54] CIRCUIT FOR FIVE LEVEL WAVEFORM SYNTHESIS

[75] Inventors: Lawrence W. Koenig, Linthicum; David W. Cripe, Pasadena, both of Md.

[73] Assignee: Westinghouse Electric Corp., Pittsburgh, Pa.

[21] Appl. No.: 205,696

[22] Filed: Jun. 13, 1988

[51] Int. Cl.$^4$ .............................................. H03F 3/217
[52] U.S. Cl. ..................................... 330/251; 363/132
[58] Field of Search ..................... 330/10, 207 A, 251; 307/242, 571; 323/271, 272; 363/17, 43, 71, 132

[56] References Cited

U.S. PATENT DOCUMENTS

| | | | |
|---|---|---|---|
| 3,227,889 | 1/1966 | Paynter | 363/431 |
| 4,208,711 | 6/1980 | Baker | 363/43 X |
| 4,443,841 | 4/1984 | Mikami et al. | 363/132 X |
| 4,670,828 | 6/1987 | Shekhawat et al. | 363/132 X |

OTHER PUBLICATIONS

Pelly et al. "The Hexfet's Integrar reverse rectifier", *Australian Electronics Engineering*, Apr. 1981, pp. 58–72.
"A High Power, High Frequency FET Inverter for a Low Frequency Transmitter", found in the *MOSPOWER Applications Handbook*, Dr. F. Lee, Dr. Dan Chen and Z. O. Fang, Siliconix Inc., Santa Clara, California, Specifically pp. 6–139 through 6–145.

*Primary Examiner*—James B. Mullins

[57] ABSTRACT

A switching power amplifier including a full bridge rectifier 10 having switches 20, 22, 24, 26, 30 and 32 connected on either side of the full bridge rectifier 10, provided to produce a five level waveform synthesis. Auxiliary switches 30 and 32 allow each half of the full bridge 10 to switch between three distinct voltage levels. Therefore, the third and fifth harmonics are eliminated, and further, the remaining harmonics are greatly suppressed. MOSFETs, bipolar transistors, vacuum tubes, etc., can be employed for the switches 20, 22, 24, 26, 30 and 32 depending upon the application of the circuit.

4 Claims, 3 Drawing Sheets

CIRCUIT FOR FIVE LEVEL WAVEFORM SYNTHESIS

BACKGROUND OF THE INVENTION

1. Field of the Invention

This invention is directed to a switching power amplifier circuit which generates a five level output voltage waveform to be used in high power communications transmitters. The duration of each of the levels of the output voltage is fixed to a width which minimizes generation of the third and fifth harmonics.

2. Description of the Prior Art

Prior art devices for power conversion use a full bridge as a two or three level waveform synthesis power amplifier for very low frequency-low frequency (VLF/LF) operation. The full bridge switching power amplifier has four legs (a leg being a transistor switch) with series adjacent legs being switched on alternately so that one switch is ON and the other switch is OFF producing a square wave output. Since a square wave is generated by switching between two different voltage levels, the term "two-level waveform synthesis" is used. The switches of each half of the full bridge are usually transformer driven so that the drive signal applied to one switch is exactly opposite to that applied to the other switch in the half bridge, guaranteeing that two adjacent switches are not simultaneously conducting at any point in time.

In a square wave produced by a two level synthesis power amplifier that has perfect symmetry, i.e., is exactly fifty percent (50%) ON and fifty percent (50%) OFF, even order (i.e., second, fourth, etc.) harmonics are not present. In the interest of maintaining spectral purity of the transmitted signal, it is desirable to eliminate as many of the remaining odd order harmonics as possible from the output square wave before it reaches the antenna. To attenuate the harmonics, power filters are employed in an antenna filter coupler. These power filters are typically multisection L-C ladder filters utilizing large ferrite or air-core inductors and ceramic or vacuum transmitting capacitors. This filter takes up approximately two-thirds (⅔) of the volume and weight of the entire cabinet of a power amplifier transmitter system, and is a major factor in the cost and complexity of the system.

In a standard full bridge circuit, if the drive signal to one half bridge is offset in phase with respect to the drive signal to the other half bridge, the voltage present at the output, which is the sum of two square waves, will be a waveform having a step in the middle. The voltage of the step will be intermediate between the upper and lower voltage levels. Since three voltages are present in this waveform, this waveform may be considered to have been produced through three-level waveform synthesis. By changing the phase of the drive signals to the two half bridges, the width of the output pulse is varied. A waveform produced by delaying the drive signal 60° will have no third, sixth or ninth harmonic.

Another circuit proposed to deal with the harmonics in the output square wave is set forth an article entitled *A High Power, High Frequency FET Inverter For A Low Frequency Transmitter* in "MOSPOWER Applications Handbook", Dr. F. Lee, Dr. Dan Chen and Z. O. Fang, Siliconix Incorporated, Santa Clara, California, pages 6-139–6-145. This circuit includes a high power, high frequency power amplification technique. The technique discussed in this reference on page 6-144 employs a sine wave synthesized through, in this case, sixteen separately phased three-level power amplifiers which are transformer coupled together.

One drawback of this scheme is that it has no facility for graceful degradation. If any of the sixteen power amplifiers in the system fails, the output waveform would be distorted and the harmonic reduction of the output could not be maintained. It would be preferable to produce a high degree of waveform synthesis within each power amplifier so that when several power amplifiers are combined, the failure of a single unit would merely result in the reduction of output power and there would be no effect on the output harmonic content.

It was therefore necessary to develop a device in which at least the third harmonic (which is the odd order harmonic closest to the fundamental and is most difficult to attenuate) and the fifth harmonic can be significantly reduced and thus, the antenna coupler filter can be made smaller and less expensive by an estimated one-third to one-half that of prior art amplifiers.

SUMMARY OF THE INVENTION

It is an object to the present invention to provide a power amplifier circuit which generates a five level output voltage to be used in high power communications transmitters.

It is another object of the present invention to reduce the third and fifth harmonics of the output waveform by at least 30 dB from that of a square wave.

It is a further object of the present invention to greatly decrease the required transmitter filtering, thus reducing the size and weight of antenna coupler filter circuitry.

It is yet a further object of the present invention to provide a five level waveform employing a single bridge amplifier.

It is an additional object of the present invention to produce an amplitude modulated waveform having zero even order and third harmonic content by obtaining a three level waveform having no even order or third harmonic content at each half-bridge and complementary phase-modulating each three level waveform by an amplitude modulating signal.

The above objects are obtained by providing a five level waveform synthesis device including a full bridge circuit and one additional switching element connected from each output terminal of each half bridge to a center point of a DC power supply. Each output terminal is capable of being switched between three different voltage levels.

These objects, together with other objects and advantages which will be subsequently apparent, reside in the details of construction and operation as more fully hereinafter described and claimed, reference being had to the accompanying drawings forming a part hereof, wherein like reference numerals refer to like parts throughout.

DESCRIPTION OF THE PREFERRED EMBODIMENTS

Figure 1:
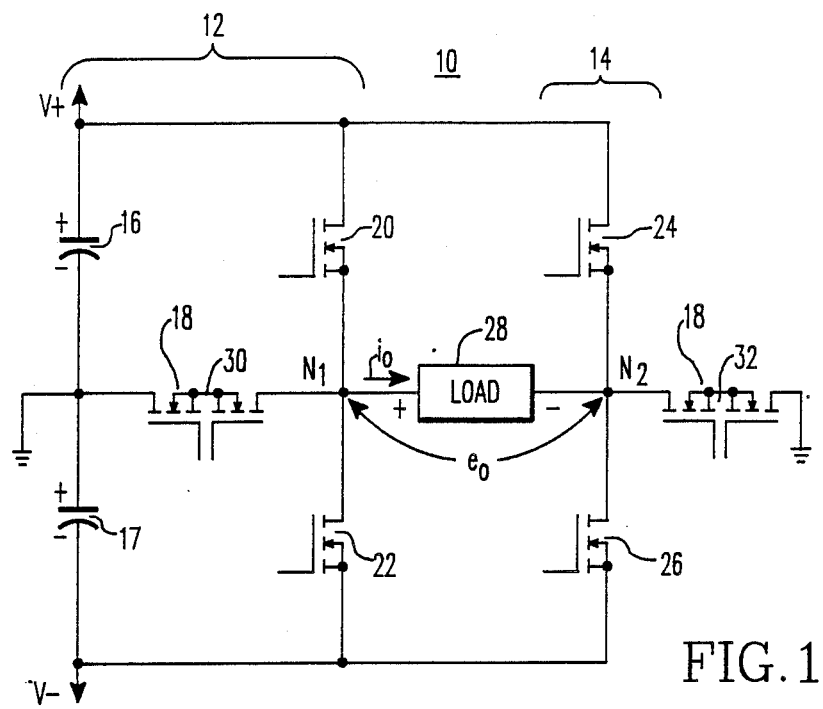
FIG. 1 is a first embodiment of a power amplifier according to the present invention.

FIG. 1 is a first embodiment of the present invention and includes a full bridge amplifier 10 having a first half bridge 12 and a second half bridge 14 coupled together. The first half bridge 12 includes two capacitors 16 and 17 connected in series between a positive power supply source V+ and a negative power supply source V−, a switch 20, and a switch 22 connected in series with the switch 20. The switch 20 has a terminal connected to the positive power supply source V+ and the switch 22 has a terminal connected to the negative power supply source V−. The second half bridge 14 includes a switch 24 and a switch 26 connected in series with the switch 24. The switch 24 has a terminal connected to the positive power supply source V+ and the switch 26 has a terminal connected to the negative power supply source V−. A load 28 is connected between the two half bridges. Center legs 18 are also provided and include a switch 30 having first and second terminals, the first terminal connected between the switches 20 and 22, and a switch 32 having first and second terminals, the first terminal connected between the switches 24 and 26. The second terminals of the switch 30 and the switch 32 are connected to ground. Switches 30 and 32 are AC switches since they must pass and block current and voltage, respectively, in both directions. These switches can be two FETs having a source and gate connected in common, the two alternate drains being the terminals of the network. FETs are employed as the AC switches 30 and 32 since they have a body diode which allows them to pass current in the reverse direction.

Figure 2:
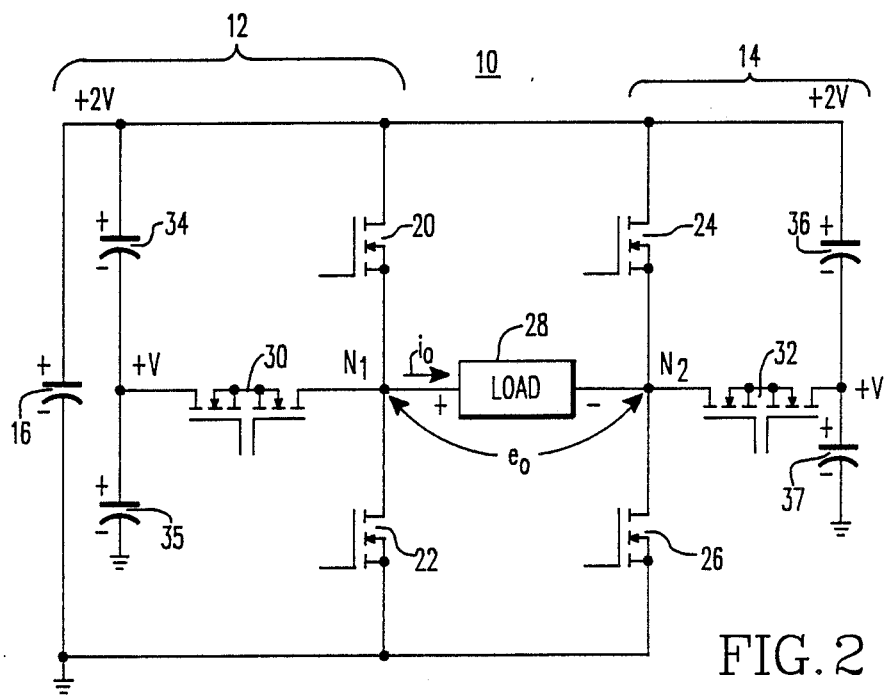
FIG. 2 is a second embodiment of a power amplifier according to the present invention.

The switches 20, 22, 24, 26, 30 and 32 in FIG. 1 and FIG. 2 are power MOSFET devices such as, IRF 350 transistors from International Rectifier or MTM15N40 transistors from Motorola, but similar bipolar junction transistors, MOSFETS, vacuum tubes, or other electric devices may be employed (i.e., the bipolar junction transistors are used for lower frequency devices). In addition, the switches 30 and 32, respectively, each contain two back-to-back FETs (such as the Motorola or International Rectifier transistors mentioned above) which maintain positive ON/OFF control of current flow in either direction. Each of the switches 30 and 32 can also be driven from a single driver since the source and gate terminals of the back-to-back transistors in each switch are connected in common.

FIG. 2 is a second embodiment of the present invention in which capacitors 34, 35, 36 and 37 (which are standard capacitors) have been added. Capacitors 34 and 36, respectively, have one terminal connected to the second terminals of the switches 30 and 32. The other terminal of each of the capacitors 34 and 36 is connected to the positive power supply source 2V+. Capacitors 35 and 37, respectively, have one terminal connected to the second terminals of switches 30 and 32 and the other terminal of these capacitors is connected to ground. Due to the symmetrical duty of the positive and negative conduction periods of switches 30 and 32, a constant voltage V+ is maintained at the common connection of capacitors 34 and 35 and at the common connection of capacitors 36 and 37. Hence, the requirement for a split power supply having an intermediate voltage in addition to the positive and negative voltages, is eliminated. Eliminating the need for a split power supply greatly enhances the operating characteristics and lessens the expense and size of the device.

Both the first and second embodiments operate essentially in the same manner and provide substantially the same output waveform. Although the power amplifier is shown using field effect transistors (FETs), bipolar transistors may also be employed. The operation of these embodiments will now be described.

Figure 3A:
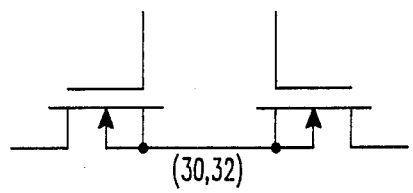
FIGS. 3A and 3B are two separate configurations for the center leg switches in FIGS. 1 and 2.
Figure 3B:
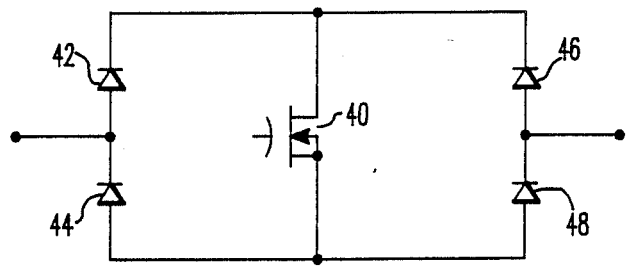

FIGS. 3A and 3B are the various center leg configurations 18 which can be employed in the circuits of FIGS. 1 and 2. FIG. 3A is basically the configuration of switches 30 and 32 shown in FIGS. 1 and 2, and is used for low voltage power amplifiers. FIG. 3B is a center bridge configuration which should be used for high voltage power amplifiers. FIG. 3B includes a switching element 40 in the center of a full bridge rectifier in which the output terminals of the total center bridge configuration are considered AC inputs to the full bridge rectifier and the switching element 40 is associated with the DC output of the full bridge rectifier. The full bridge rectifier includes the diodes 42, 44, 46 and 48.

Each half bridge in the present invention produces a three level waveform having a 60° dead zone in the center. The two half bridge outputs are offset from each other by 36°. The timing of the drive waveforms is generated by a clock (which is a conventional circuit and is therefore not shown) which operates at thirty times the fundamental frequency and is divided down by a counter and decoders which set flip-flop states (the counter, decoders and flip-flops are all conventional circuits and are not shown). The outputs from the flip-flops are input to driver circuits (which are conventional circuits and also are not shown). The clock operates at thirty times the fundamental frequency because the duration of all of the steps in the output waveform are in increments of 12° which is one-thirtieth of 360° (a complete cycle). In order to eliminate the third harmonic, the three level waveform requires having the center leg conduction interval at 60° and the ON interval at 120°. In the present invention, the five level waveform also eliminates the fifth harmonic in addition to the third harmonic. Thus, two of the three level waveforms are superimposed and are identical to the 60° interval, but are shifted in phase by 36°.

Figure 4:
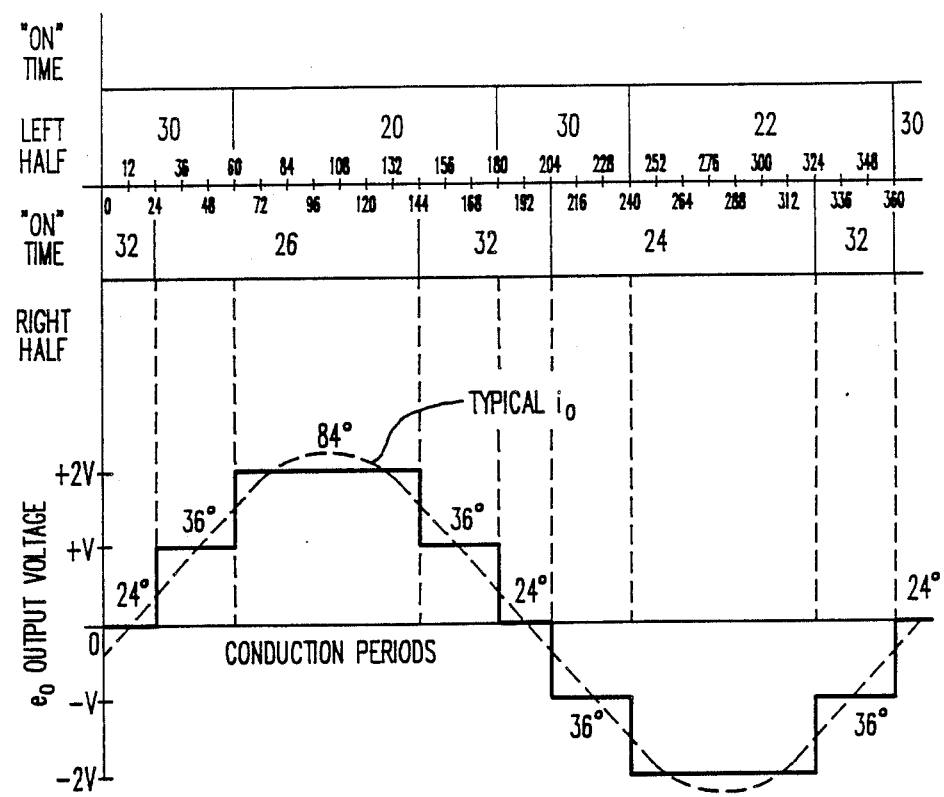
FIG. 4 is a timing diagram of the amplifier output voltage for either FIG. 1 or FIG. 2 when used as a power amplifier producing minimal third and fifth harmonics.

FIG. 4 is a timing diagram for the circuit shown in FIG. 2 (and substantially that shown in FIG. 1) including the periods of conduction for each of the six switches 20, 22, 24, 26, 30 and 32 when the third and fifth harmonic outputs of the power amplifier are minimized. In addition, the output voltage e is shown for one cycle.

At any time one switch in each half-bridge is conducting. At no time are more than two switches in the full bridge circuit conducting. The switches in each half bridge are driven in a cyclical sequence such that the voltage present at the output describes a periodic waveform having three distinct voltages —a positive supply voltage, a negative supply voltage, and a voltage between the positive and negative supply voltages. The output waveform is the algebraic difference of the voltages present at respective outputs of each half bridge and traverses five distinct voltages. This operation, shown in FIG. 4, will now be described with respect to FIG. 2.

In FIG. 4, at zero time, the switch 32 and the switch 30 are ON together. During this interval, both terminals of the output load are connected to the same voltage, thus the output voltage is zero. At 24° conduction time, the switch 32 is turned OFF and the switch 26 is turned ON, grounding the negative load terminal, and V+ on the positive load terminal. Therefore, the load voltage is effectively V+. At 60° conduction time, the switch 30 is turned OFF and the switch 20 is turned ON. This places a voltage 2V+ on the positive load terminal and ground at the negative load terminal, making the load voltage 2V+, as shown. At 144° conduction time, the switch 26 turns OFF and the switch 32 turns ON. This places V+ on the negative load terminal, with a voltage 2V+ on the positive terminal. Thus, the effective load voltage decreases as shown to V+.

At 180° conduction time, the switch 20 turns OFF and the switch 30 turns ON. With the switch 30 and the switch 32 ON simultaneously, the net load voltage is zero. At 204° conduction time, the switch 32 is turned OFF and the switch 24 is turned ON, bringing the negative load terminal to 2V+ while the positive load terminal remains at V+, resulting in a V− output voltage. At 240° conduction time, the switch 30 is turned OFF and the switch 22 is turned ON placing ground on the positive load terminal, while 2V+ remains on the negative load terminal. Therefore, the net load voltage is 2V− as shown in FIG. 4. At 324° conduction time, the switch 24 is turned OFF and the switch 32 is turned ON, placing the negative load terminal at V+, with ground remaining on the positive load terminal. Therefore, the net load voltage is V−. At 360° conduction time, the switch 22 is turned OFF and the switch 30 is turned ON placing a net zero voltage across the load. This completes the circuit operation for one cycle. It should be noted that FIG. 4 is an ideal stepped output waveform shown for the operation of the power amplifier. Any deviation from this waveform, whether due to droop in the supply voltage, reactance of unwanted circuit inductances, etc., will result in degradation of the harmonic rejection performance of the power amplifier unless the timing of the drive signals is adjusted accordingly. This output of the power amplifier becomes the input to a low pass filter and load (not shown) such as employed in high power VLF/LF communication transmitters. This rejects the higher harmonics (seventh, eleventh, etc.) present in the voltage waveform, thereby yielding a sinusoidal current waveform.

Figure 5:
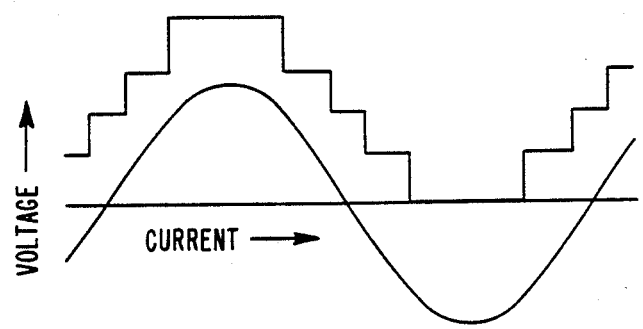
FIG. 5 is a waveform diagram of the power amplifier output voltage with respect to the power output current according to the second embodiment of the present invention shown in FIG. 2.

FIG. 5 is the actual output waveform of the power amplifier in FIG. 2. As shown in this waveform diagram, the power amplifier output voltage is approximately 10 volts/division and the output current is 1 ampere/division.

Table 1, set forth below, gives the measured waveform analysis of the five level waveform synthesis circuit in FIGS. 1 and 2, which was built and tested. The circuit was operated at 23 KHz and 30 watts and is compared with the output spectrum of a typical square wave amplifier.

TABLE 1

| Harmonic Frequency | Five Level Output Spectrum, dB | Square Wave Output Spectrum, dB | Improvement Of Five Level Circuit, dB |
|---|---|---|---|
| Fundamental | 0 | 0 | 0 |
| Second | −46.2 | −45 | −1.2 |
| Third | −42.3 | −9.5 | −32.8 |
| Fourth | −48.6 | −50 | +1.4 |
| Fifth | −48.5 | −14 | −34.5 |
| Sixth | −62.3 | −60 | −2.3 |
| Seventh | −20.3 | −16.9 | −3.4 |
| Eighth | −65 | −60 | −5.0 |
| Ninth | −43.5 | −19.1 | −24.4 |

As seen from the above table, the third harmonic is suppressed by −42.3 dB, and the fifth harmonic is suppressed by −48.5 dB. No effort is made to attenuate the seventh harmonic in the power amplifier output. Theory predicts that it would be present in the five level waveform at approximately −19.2 dB and in actuality it is present at −20.3 dB.

Any number of waveform synthesis power amplifiers can be combined to obtain higher power output with no degradation or change in harmonic content; whereas in prior art waveform synthesis devices which rely on a specific number of power amplifiers combined to generate a specified output waveform, the output is degraded when one or more of the power amplifiers is removed.

The present invention is also useful in frequency shift keying (FSK). In frequency shift keying systems, a constant amplitude carrier is present. For data bits of 0 or 1, the frequency is shifted from one frequency to another. The receiver includes detectors and the frequency is demodulated. At times it may be desirous to transmit a number of simultaneous FSK signals from a transmitter, i.e., different carriers are being produced from a single transmitter. In prior art devices, separate transmitters for each signal are required. With a three level synthesis bridge, the half bridges can be operated independently, each one producing a different carrier and a different FSK signal. Applying this to the five level synthesis power amplifier of the present invention, four separate FSK signals can be produced from a single power amplifier since the three level output waveform at each half-bridge is considered the sum of two independent square wave signals. When this circuit is employed for FSK harmonic reduction no longer exists. The benefit, however, of the ability to generate four separate FSK signals from a single power amplifier is obtained. Thus, there is a trade-off depending on the type of application desired.

Another application of the five level synthesis power amplifier of the present invention having two independent three level waveforms, is that the waveforms can be phased in and out with respect to each other. Therefore, effective amplitude modulation of the fundamental can be obtained while maintaining the third harmonic rejection.

The foregoing is considered as illustrative only of the principles of the invention. Further, since numerous modifications and changes will readily occur to those skilled in the art, it is not desired to limit the invention to the exact construction and applications shown and described, and accordingly, all suitable modifications and equivalents may be resorted to, falling within the scope of the invention and the appended claims and their equivalents.

We claim as the invention:

1. A power amplifier, comprising:
a bridge circuit, including first and second half bridges, said first and second half bridges including:
   first and second field effect transistors having drains connected to a positive power supply voltage, having gates, and having sources as outputs; and
   third and fourth transistors having drains connected as outputs, having gates, and having sources connected to a negative power supply, said source of said first field effect transistor and said drain of said third field effect transistor being connected together at a first connection node and said source of said second field effect transistor and said drain of said fourth field effect transistor being connected together at a second connection node;
a load connected between said first and second connection nodes;
switching circuits, connected within said first and second half bridges, for switching between three different power supply voltages, said switching circuits including:
   a first portion including first and second field effect transistors having sources and gates commonly connected and having drains as outputs, a drain of said first field effect transistor being connected to said first connection node, and a drain of said second field effect transistor being connected to an intermediate power supply voltage; and
   a second portion including third and fourth field effect transistors having sources and gates commonly connected and having drains as outputs, a drain of said third field effect transistor connected to said second connection node, and a drain of said fourth field effect transistor connected to the intermediate power supply voltage;
a capacitive circuit, connected to said switching circuits for providing constant voltage to said switching circuits, said capacitive circuit including:
   a first capacitor connected between the positive power supply voltage and said drain of said second field effect transistor of said switching circuits;
   a second capacitor connected between the positive power supply voltage and said drain of said fourth field effect transistor of said switching circuits;
   a third capacitor connected between said drain of said second field effect transistor of said switching circuits and the negative power supply voltage;
   a fourth capacitor connected between said drain of said fourth field effect transistor of said switching circuits and the negative power supply voltage; and
   a fifth capacitor connected to said first capacitor and between the positive power supply voltage and the negative power supply voltage.

2. A power amplifier including a bridge circuit for outputting a periodic switching waveform containing five voltage levels, comprising:
a first half bridge;
a second half bridge connected to said first half bridge;
switching circuits, connected within said first and second half bridges of the bridge circuit, for switching between three different power supply voltages, the three different power supply voltages including a positive power supply voltage, a negative power supply voltage, and an intermediate power supply voltage between the positive and negative power supply voltages, said switching circuit of each of said first and second half bridges including:
   a first switch connecting the positive power supply voltage and an output node;
   a second switch connecting the negative power supply voltage and the output node; and
   a third switch connecting the output node and the intermediate power supply voltage, said first and second switches being DC switches and said third switch being an AC bidirectional switch;
a capacitive circuit, connected to said switching circuits, for providing constant voltage to said switching circuits; and
load means connected between said third switch of each of said first and second half bridges.

3. A power amplifier according to claim 2, wherein the periodic switching waveform output from said power amplifier has third and fifth harmonics eliminated.

4. A power amplifier according to claim 2, wherein said capacitive circuit comprises:
   a first capacitor connected between the positive power supply voltage and the third switch connected to the intermediate power supply voltage; and
   a second capacitor connected between the third switch connected to the intermediate power supply voltage and the negative power supply voltage.

* * * * *